(12) United States Patent
Nam et al.

(10) Patent No.: US 7,422,830 B2
(45) Date of Patent: Sep. 9, 2008

(54) METHOD FOR DETECTING FAILURE OF DATABASE PATTERNS OF PHOTO MASK

(75) Inventors: Byung Ho Nam, Daegu-si (KR); Byoung Sub Nam, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 574 days.

(21) Appl. No.: 11/084,618

(22) Filed: Mar. 17, 2005

(65) Prior Publication Data

US 2006/0141368 A1 Jun. 29, 2006

(30) Foreign Application Priority Data

Dec. 29, 2004 (KR) .................. 10-2004-0114736

(51) Int. Cl.
*G03F 1/00* (2006.01)
(52) U.S. Cl. .......................................... 430/5
(58) Field of Classification Search .............. 430/5, 430/394; 716/19–21
See application file for complete search history.

(56) References Cited

U.S. PATENT DOCUMENTS 5,481,624 A 1/1996 Kamon
6,080,670 A 6/2000 Miller et al.
6,998,205 B2 * 2/2006 Huang ........................... 430/5
7,290,227 B2 * 10/2007 Lee ............................... 716/4

\* cited by examiner

*Primary Examiner*—Stephen Rosasco
(74) *Attorney, Agent, or Firm*—Townsend and Townsend and Crew LLP

(57) ABSTRACT

A method for detecting failure of database patterns of a photo mask including designing the database patterns of the photo mask according to a design rule of a semiconductor element; performing optical proximity correction (OPC) of the designed database patterns; and detecting failure of the database patterns by obtaining a plurality of bias values based on at least two space widths according to each of line critical dimensions (CDs) of the designed database patterns and by detecting the shape of the pattern having the optimum bias value. The method applies different space widths to the patterns according to critical dimensions of lines of the patterns of the photo mask to preliminarily detect patterning failure varied according to illuminating systems, sub-films, and thicknesses of resist, and to correct failure of the patterns, such as collapse or bridges of the patterns, generated from the different lengths of patterns lines having the same critical dimension, using different bias values.

13 Claims, 5 Drawing Sheets

Fig.4B

| line CD | space width | bias value | failure result |
|---|---|---|---|
| 89<w<=90 | s< a | $-\beta$ | bridge |
| 89<w<=90 | b <s | $+\alpha$ | collapse |
| 90<w<=100 | s< a | $-\beta$ | bridge |
| 90<w<=100 | b <s | $+\alpha$ | collapse |
| 100<w<=110 | s< a | $-\beta$ | bridge |
| 100<w<=110 | b <s | $+\alpha$ | collapse |
| 110<w<=120 | s< a | $-\beta$ | bridge |
| 110<w<=120 | b <s | $+\alpha$ | collapse |
| 120<w<=130 | s< a | $-\beta$ | bridge |
| 120<w<=130 | b <s | $+\alpha$ | collapse |
| 130<w<=140 | s< a | $-\beta$ | bridge |
| 130<w<=140 | b <s | $+\alpha$ | collapse |
| 140<w<=150 | s< a | $-\beta$ | bridge |
| 140<w<=150 | b <s | $+\alpha$ | collapse |
| 150<w<=160 | s< a | $-\beta$ | bridge |
| 150<w<=160 | b <s | $+\alpha$ | collapse |
| 160<w<=170 | s< a | $-\beta$ | bridge |
| 160<w<=170 | b <s | $+\alpha$ | collapse |
| 170<w<=180 | s< a | $-\beta$ | bridge |
| 170<w<=180 | b <s | $+\alpha$ | collapse |
| 180<w<=190 | s< a | $-\beta$ | bridge |
| 180<w<=190 | b <s | $+\alpha$ | collapse |
| 190<w<=200 | s< a | $-\beta$ | bridge |
| 190<w<=200 | b <s | $+\alpha$ | collapse |

METHOD FOR DETECTING FAILURE OF DATABASE PATTERNS OF PHOTO MASK

CROSS-REFERENCES TO RELATED APPLICATIONS

This application claims the benefit of Korean Patent Application No. 10-2004-114736 filed Dec. 29, 2004, the entire contents of which are hereby incorporated by reference for all purposes

FIELD OF INVENTION

The present invention relates to a method for testing patterns of a photo mask, and more particularly to a method for detecting failures in database patterns of a photo mask.

BACKGROUND OF THE INVENTION

As the minimum line widths of elements integrated into a semiconductor chip and connection wires thereof are reduced, it is difficult to avoid an optical proximity effect (OPE) of patterns formed on a wafer by means of a conventional lithography technique using ultraviolet rays. Since the wavelength of an I-beam, which is one recently used ultraviolet rays, is 0.365 μm, while the minimum critical dimension of the line width is 0.35 μm, the OPE of the patterns due to diffraction and interference of light severely limits a fabrication process of the semiconductor chip. It is estimated that the OPE of the patterns becomes severer so as to meet the reduction in the minimum critical dimension of the line width. Accordingly, optical proximity correction (OPC), which corrects the OPE generated in resolution limit in photolithography, is inevitably performed.

In photolithography, patterns of the photo mask are reproduced onto a wafer through an optical lens. Here, an optical system projecting images serves as a low-pass filter, and an image formed on the wafer has a distorted shape. Where a photo mask having a rectangular shape is used, portions having a high frequency, i.e., edge portions, do not permeate the optical lens, thereby forming a circular-shaped pattern on the wafer. In the case that the pattern of the photo mask has a large size (or cycle), since the basic space frequency is low, comparatively high-ordered frequencies can permeate the optical lens, thereby forming a pattern on the wafer similar to the pattern of the photo mask. However, in the case where the pattern of the photo mask has a small size, since the space frequency is high, the frequency permeating the optical lens is reduced, thereby causing the distortion of the pattern to become severe.

Accordingly, until now, the above problems have been resolved by development of photolithography equipment. However, the development of this equipment is limited, and approaches in an aspect of the design field are now needed. In the OPC of the patterns of the photo mask, the patterns of the photo mask are deformed in advance in consideration of the above distortion so that final patterns formed on a wafer have the desired shape. Generally, OPC employs a rule-based method, in which several rules are made and are reflected in designing the patterns.

FIG. 1 is a flow chart schematically illustrating a conventional process for testing database patterns of a photo mask.

As shown in FIG. 1, in the conventional process, a rule file regarding line critical dimensions (CD) or spaces of designed database patterns are made, design rule check (DRC) of the rule file is performed, and then optical proximity correction (OPC), in which the shapes of the database patterns are deformed so that the final patterns exposed on a wafer have the desired shapes, is formed (S10~S30).

In the conventional process for testing database patterns of the photo mask, the line CDs or the spaces of the patterns are tested in the DRC, but failure of the patterns due to failure in a patterning step is not detected. In the patterns of the same critical dimension, it is impossible to distinguishably test a pattern having a long line length and a pattern having a short line length. Accordingly, in the case that the pattern having a long line length, which was corrected by the OPC, is exposed onto the wafer, the patterns collapse or a bridge is formed between the neighboring patterns.

BRIEF SUMMARY OF THE INVENTION

Therefore, the present invention has been made in view of the above problems, and it is an object of the present invention to provide a method for detecting failure of database patterns of a photo mask, in which applies different space widths to the patterns according to critical dimensions of the lines of the patterns of the photo mask so as to detect patterning failure differences according to the illumination system, sub-film, and thickness of the resist, thereby preliminarily detecting failure, such as collapse or bridges of the pattern, generated from the different line lengths of the patterns having the same critical dimension.

In accordance with the present invention, the above and other objects can be accomplished by the provision of a method for detecting failure of database patterns of a photo mask comprising: designing the database patterns of the photo mask according to a design rule of a semiconductor element; performing optical proximity correction (OPC) of the designed database patterns; and detecting failure of the database patterns by obtaining a plurality of bias values based on at least two space widths according to each of line critical dimensions (CDs) of the designed database patterns and by detecting the shape of the pattern having the optimum bias value.

Preferably, the plural bias values may include at least one positive value and at least one negative value.

Further, preferably, the detection of failure of the database patterns may be performed for patterns of all chips of the semiconductor element, for patterns, which went through the OPC, out of the designed database patterns.

Moreover, preferably, the method may further comprise performing design rule check (DRC) of the designed database patterns before the OPC is performed.

Preferably, the detection of failure of the database patterns may be performed for patterns, which violate the design rule as results of the DRC.

Further, preferably, the detection of failure of the database patterns may be performed by obtaining a plurality of the bias values according to the depth of focus (DOF) margins and by detecting the shape of the pattern having the bias value with the optimum DOF margin.

BRIEF DESCRIPTION OF THE DRAWINGS

The above and other objects, features and other advantages of the present invention will be more clearly understood from the following detailed description taken in conjunction with the accompanying drawings, in which:

FIGS. 4A and 4B are schematic views respectively illustrating methods for obtaining a rule table and bias values in the process of the present invention;

DETAILED DESCRIPTION OF THE INVENTION

Now, a preferred embodiment of the present invention will be described in detail with reference to the annexed drawings.

Figure 1:
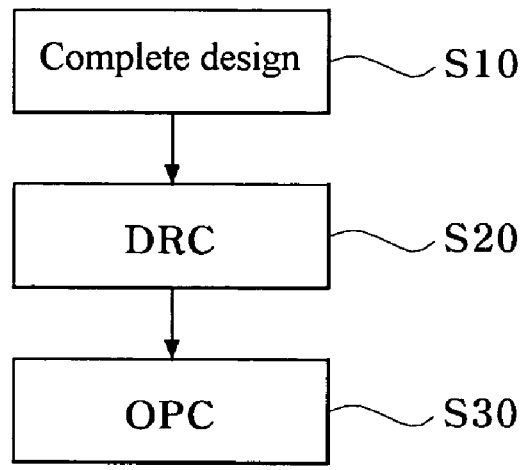
FIG. 1 is a flow chart illustrating a conventional process for detecting failure of database patterns of a photo mask.
Figure 2:
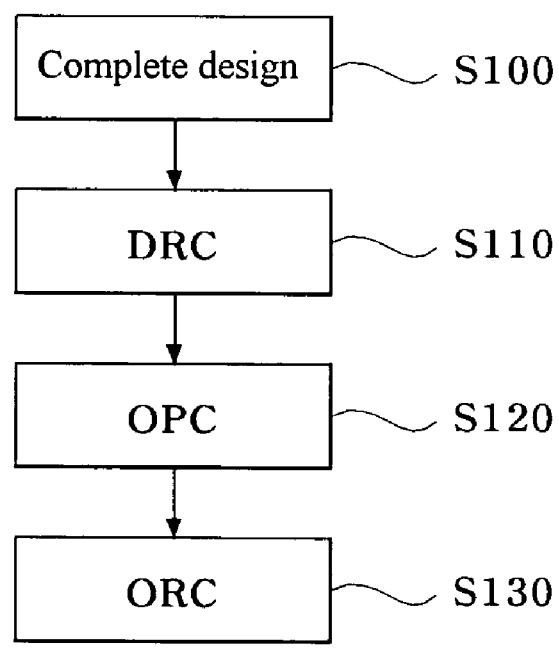
FIG. 2 is a flow chart illustrating a process for detecting failure of database patterns of a photo mask in accordance with the present invention.

FIG. 2 is a flow chart illustrating a process for detecting failure of database patterns of a photo mask in accordance with the present invention.

As shown in FIG. 2, database patterns are designed on a photo mask based on a design rule of a semiconductor element (S100).

A rule file regarding line critical dimensions (CDs) or spaces of the designed database patterns is made, and design rule check (DRC) of the rule file is performed (S110).

Optical proximity correction (OPC), in which shapes of the designed patterns are deformed so that final patterns exposed onto a wafer have a desired shape, is performed (S120).

Optical rule check (ORC), in which a plurality of bias values are calculated based on at least two space widths according to each of the respective line CDs and the shape of the pattern having the optimum bias value is obtained using the above bias values (S130).

Accordingly, the process for detecting failure of the database patterns of the photo mask in accordance with the present invention comprises the ORC, in which a plurality of the bias values are calculated based on at least two space widths according to each of the respective line CDs and the shapes of the patterns having the optimum bias value using the above bias values, thereby biasing the patterns having the same critical dimension so that failure, such as the collapse of the patterns or the bridge between the patterns, is prevented according to line lengths.

Figure 3:
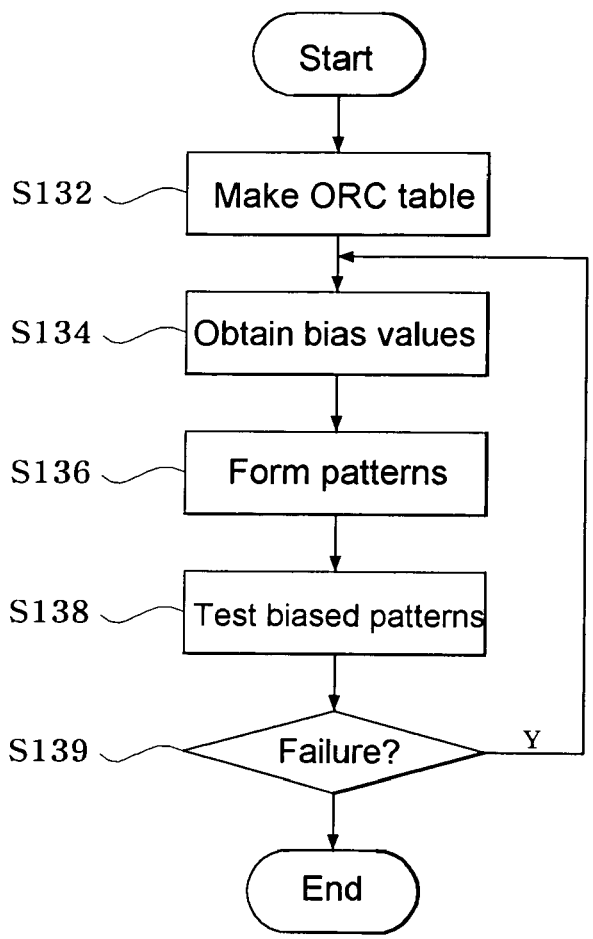
FIG. 3 is a flow chart illustrating a process for detecting failure of database patterns of a photo mark, which goes through OPC, in accordance with an embodiment of the present invention.

FIG. 3 is a flow chart illustrating a process for detecting failure of database patterns, which went through OPC, on a photo mask in accordance with an embodiment of the present invention. Hereinafter, with reference to FIG. 3, the process for detecting failure of database patterns gone through OPC will be described.

First, as shown in FIG. 4B, an ORC rule table, in which at least two space widths are divided according to each of the respective line CDs of a plurality of patterns designed by the design rule of the semiconductor element, is made (S132). For example, in the ORC rule table, the patterns, having a line CD of more than 200 nm, are divided into patterns having a space width of not more than 190 nm and patterns having a space width of more than 240 nm.

A plurality of bias values is obtained based on the line CDs of the patterns and at least the two space widths of each of the patterns, which are stated in the ORC table (S134).

Preferably, the plural bias values include at least one positive (+) value and at least one negative (−) value. For example, in the case that the patterns have line widths of 150~160 nm and space widths of less than 250 nm, the bias values are +10 nm, +20 nm, +30 nm, and +40 nm according to depth of focus (DOF) margins. In the case that the bias value is a positive (+) value, the pattern has a collapsed shape. On the other hand, in the case that the bias value is a negative (−) value, the pattern has a bridged shape.

A plurality of biased patterns are formed by correcting (lengthening or shortening) the widths of the patterns according to the bias values using a simulation tool (S136). That is, in the case that the pattern has a line width of 150~160 nm, a plurality of biased patterns are formed by adding the bias values of +10 nm, +20 nm, +30 nm, and +40 nm to the corresponding line width.

Thereafter, the plural biased patterns are tested by a viewer, and thus the pattern having the optimum bias value is selected (S138).

The pattern is corrected using the optimum bias value as described above, it is determined whether or not failure of another pattern is detected, and, when it is determined that failure of another pattern is detected, a process from step S134 is repeated (S139). In the case it is determined that failure of any pattern is not detected in step S139, the process is terminated. Alternately, the present invention may provide a process for detecting failure of patterns using ORC rule tables made according to DOF margins of an exposure device.

Figure 4A:
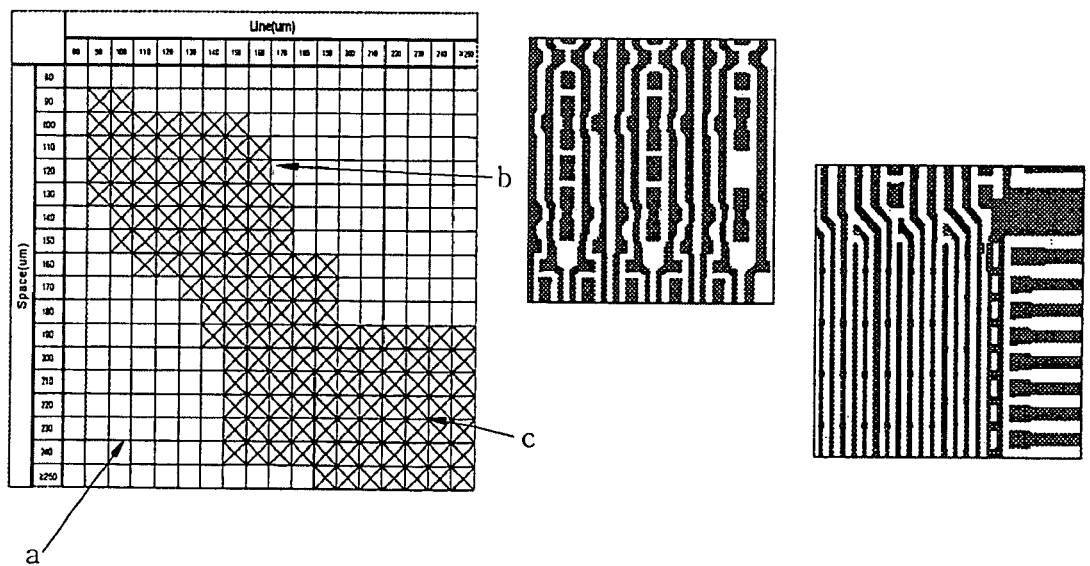

FIGS. 4A and 4B are schematic views respectively illustrating methods for obtaining a rule table and bias values in the process of the present invention.

As shown in FIG. 4A, in the process of the present invention, the detection of failure is performed only for patterns, which are (a) collapsed or (b) bridged and thus go through OPC. Alternately, the detection of failure is performed only for patterns, which violate the design rule, as results of DRC, or is performed for the patterns of all chips.

The ORC rule table, as shown in FIG. 4B, includes line CDs, at least two space widths, corresponding bias values, and failure results of patterns. For example, in the case that patterns have line widths of 150~160 nm, space widths between the corresponding patterns are divided into s<a and b>s, bias values of the patterns are +α or −β based on the respective space widths, and failure results of the patterns are bridge and collapse according to the bias values, wherein a, b, α and β are specified values.

Figure 5:
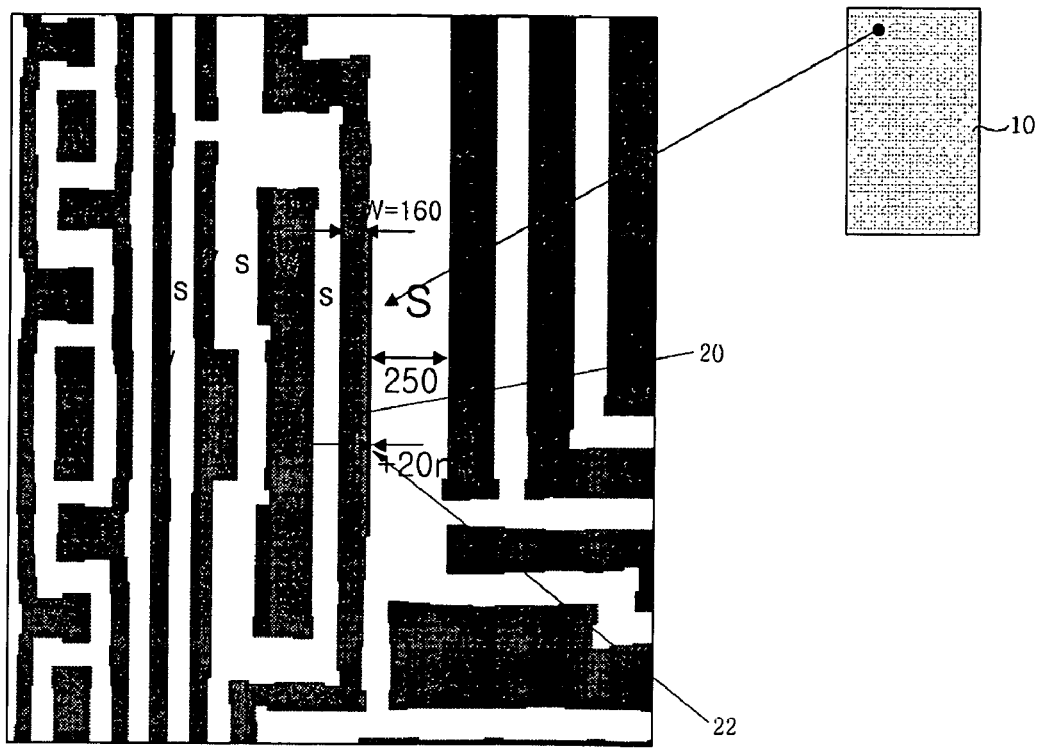
FIG. 5 is a schematic view illustrating one example of the process for detecting failure of database patterns of a photo mask in accordance with the present invention.

FIG. 5 is a schematic view illustrating one example of the process for detecting failure of database patterns in a photo mask in accordance with the present invention.

In the process for detecting failure of the database patterns of the photo mask, shown in FIG. 5, in the case that patterns 20 of a semiconductor chip 10 have line widths of 150~160 nm, a space width (S) between the corresponding patterns 20 is less than 250 nm. Thus, bias values of the corresponding patterns 20 are +10 nm (DOF=0.3 μm), +20 nm (DOF=0.2 μm), +30 nm (DOF=0.1 μm), and +40 nm (DOF=0.0 μm) according to DOF margins. Here, the optimum bias value 22 is +20 nm (DOF=0.2 μm) having the optimum DOF margin.

Figure 6:
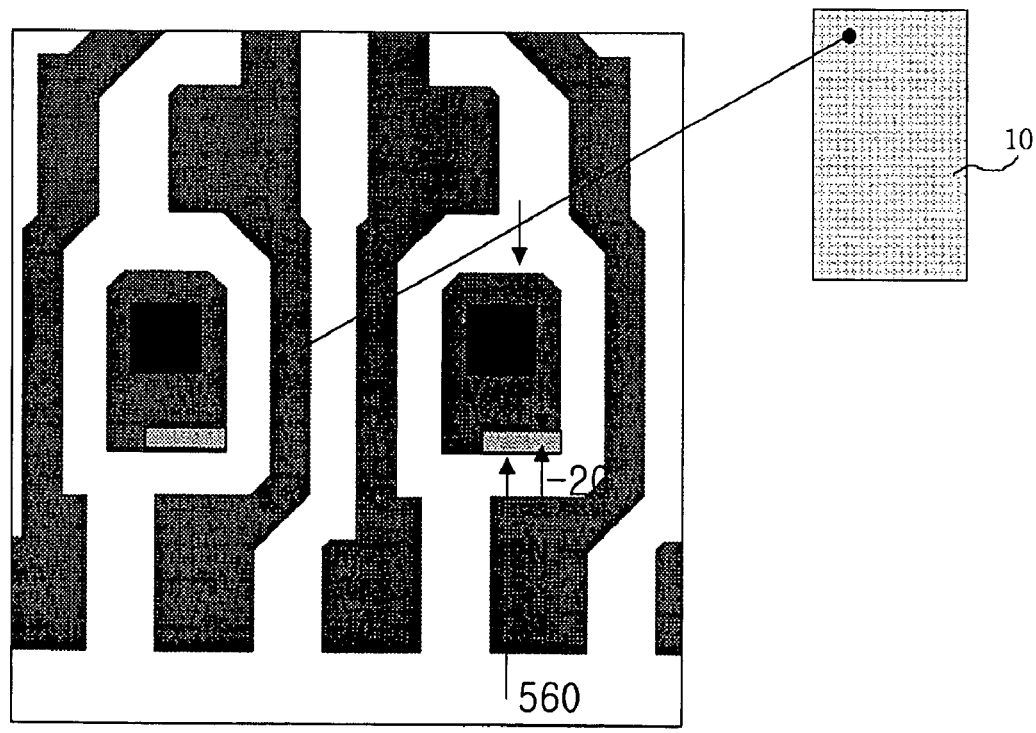
FIG. 6 is a schematic view illustrating another example of the process for detecting failure of database patterns of a photo mask in accordance with the present invention.

FIG. 6 is a schematic view illustrating another example of the process for detecting failure of database patterns in a photo mask in accordance with the present invention.

In the process for detecting failure of the database patterns of the photo mask, shown in FIG. 6, in the case that patterns of the semiconductor chip 10 have line widths of 500~560 nm, a space width (S) between the corresponding patterns is less than 160 nm. Thus, bias values of the corresponding patterns are −10 nm (DOF=0.3 μm), −20 nm (DOF=0.2 μm), −30 nm (DOF=0.1 μm), and −40 nm (DOF=0.0 μm) according to DOF margins. Here, the optimum bias value is −20 nm (DOF=0.2 μm) having the optimum DOF margin.

Figure 7:
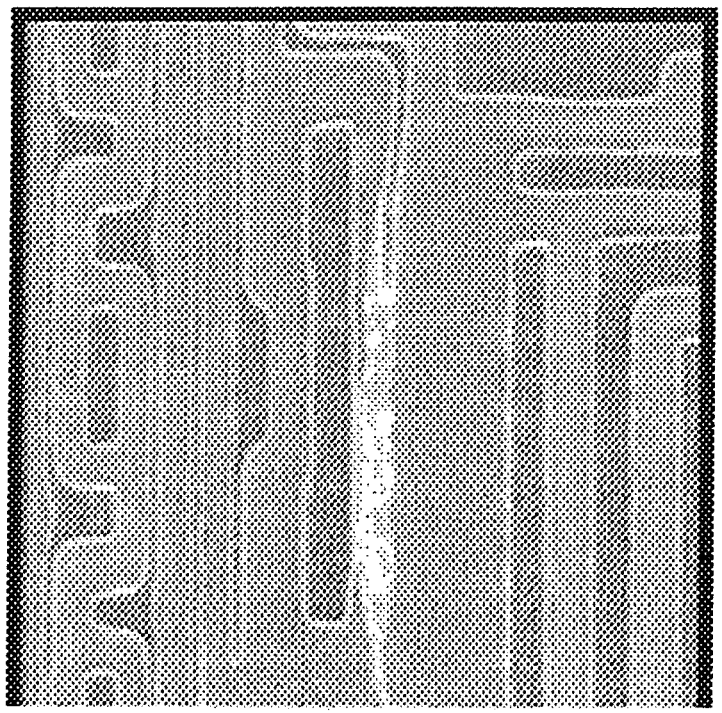
FIG. 7 is a schematic view illustrating shapes of patterns, which are subjects of the process of FIG. 5, formed on a wafer.

FIG. 7 is a schematic view illustrating shapes of patterns, which are subjects of the process of FIG. 5, formed on a wafer.

As shown in FIG. 7, when patterns having the same line CD among database patterns of a photo mask are formed on the wafer, the patterns may be collapsed according to line lengths of the patterns. The process of the present invention obtains bias values by varying space widths between the patterns according to the line CDs of the patterns and lengthening or shortening the corresponding patterns using the optimum bias value selected from a plurality of bias values set according to DOF margins, thereby preventing collapse of the patterns generated when the database patterns of the photo mask are patterned on the wafer.

Accordingly, when the process of the present invention is applied to the failed patterns of FIG. 7, it is possible to minimize the collapse of the patterns due to the bias values of the patterns.

Figure 8:
FIG. 8 is a schematic view illustrating shapes of patterns, which are subjects of the process of FIG. 6, formed on a wafer.

FIG. 8 is a schematic view illustrating shapes of patterns, which are subjects of the process of FIG. 6, formed on a wafer.

As shown in FIG. 8, when patterns having the same line CD among database patterns of a photo mask are formed on the wafer, the patterns may be bridged according to line lengths of the patterns. The process of the present invention obtains bias values by varying space widths between the patterns according to the line CDs of the patterns and lengthening or shortening the corresponding patterns using the optimum bias value selected from a plurality of bias values set according to DOF margins, thereby preventing bridge of the patterns generated when the database patterns of the photo mask are patterned on the wafer.

Accordingly, when the process of the present invention is applied to the failed patterns of FIG. 8, it is possible to minimize the bridge of the patterns due to the bias values of the patterns.

As apparent from the above description, the present invention provides a method for detecting failure of database patterns of a photo mask, to which applies different space widths the patterns according to critical dimensions of lines of the patterns of the photo mask to preliminarily detect patterning failure varied according to illuminating systems, sub-films, and the thicknesses of the resist, and to correct failure of the patterns, such as collapse or bridges of the patterns, generated from the different lengths of patterns lines having the same critical dimension, using different bias values.

Further, the method obtains a plurality of bias values of each of failed patterns according to a plurality of depth of focus (DOF) margins, and corrects failure of patterns based on the bias value of the optimum DOF margin, thereby improving resolution of the patterns.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for generating a pattern for a photomask, the method comprising:
designing the pattern for the photomask according to a design rule of a semiconductor element, the pattern designed having a given line critical dimension and being associated with first and second space widths;
obtaining a first bias associated with the first space width and a second bias associated with the second space width; and
determining whether or not the pattern designed will experience a failure based on values of the first and second bias associated with the first and second space widths with respect to the line critical dimension,
wherein the pattern designed is used to generate a pattern over a substrate.

2. The method according to claim 1,
wherein the first bias is of a positive value and the second bias is of a negative value.

3. The method according to claim 1, further comprising:
obtaining at least a third bias associated with the first space width and then determining if the pattern designed will experience a failure based on the third bias associated with the first space width.

4. The method according to claim 1, further comprising:
performing an optical proximity correction (OPC) of the pattern designed prior to performing the determining step.

5. The method according to claim 1, further comprising:
performing an optical proximity correction (OPC) of the pattern designed; and
performing a design rule check (DRC) of the pattern designed before the OPC is performed.

6. The method according to claim 5,
wherein the determining step is performed only if the pattern designed is detected as violating the design rule as a result of the DRC.

7. The method according to claim 1,
wherein a plurality of bias values are provided for the first space width according to depth of focus (DOF) margins and a plurality of bias values are provided for the second space width according to the depth of focus margins, and
wherein the optimum bias values for the first and second space widths are obtained by repeating the obtaining and determining steps.

8. The method of claim 1, wherein the failure is a collapse where the pattern designed falls down side ways.

9. The method of claim 8, wherein the failure is deemed to have occurred when the second bias associated with the second space width is of at least a given positive value.

10. The method of claim 1, wherein the failure is a bridge where the pattern design makes an unintended contact with another pattern.

11. The method of claim 10, wherein the failure is deemed to have occurred when the first bias associated with the first space width is at least of a given negative value.

12. The method of claim 1, wherein the first space width and the second space width vary according to the line critical dimension.

13. A method for generating a photomask pattern for a semiconductor device, the method comprising:
designing the pattern according to a design rule of a semiconductor element, the pattern designed having a given critical dimension and being associated with first and second space widths;
obtaining a first bias associated with the first space width and a second bias associated with the second space width; and
determining whether or not the pattern designed will experience a collapse or bridge based on values of the critical dimension and the first and second bias associated with the first and second space widths,
wherein the pattern designed is used to generate a pattern over a substrate,
wherein the collapse is associated with a positive bias value and the bridge is associated with a negative bias value.

* * * * *